(12) United States Patent
Chu et al.

(10) Patent No.: US 7,105,427 B1
(45) Date of Patent: Sep. 12, 2006

(54) METHOD FOR SHALLOW DOPANT DISTRIBUTION

(75) Inventors: Wei-Kan Chu, Pearland, TX (US); Lin Shao, Houston, TX (US); Xinming Lu, Ele Segundo, CA (US); Jiarui Liu, Pearland, TX (US); Xuemei Wang, Houston, TX (US)

(73) Assignee: Wei Kan Chu, Pearland, TX (US)

( * ) Notice: Subject to any disclaimer, the term of this patent is extended or adjusted under 35 U.S.C. 154(b) by 0 days.

(21) Appl. No.: 10/929,939

(22) Filed: Aug. 30, 2004

Related U.S. Application Data

(62) Division of application No. 10/237,417, filed on Sep. 9, 2002, now Pat. No. 6,812,523.

(60) Provisional application No. 60/323,862, filed on Sep. 21, 2001, provisional application No. 60/323,863, filed on Sep. 21, 2001.

(51) Int. Cl.
*H01L 21/425* (2006.01)

(52) U.S. Cl. .................. 438/530; 438/289; 438/766

(58) Field of Classification Search ............... 438/217, 438/289, 308, 529, 530, 532, 766
See application file for complete search history.

(56) References Cited

U.S. PATENT DOCUMENTS 5,861,632 A * 1/1999 Rohner .................. 250/492.21
6,159,856 A * 12/2000 Nagano ...................... 438/683

* cited by examiner

*Primary Examiner*—Zandra V. Smith
*Assistant Examiner*—Pamela E Perkins
(74) *Attorney, Agent, or Firm*—Rodney T Hodgson

(57) ABSTRACT

Vacancies and dopant ions are introduced near the surface of a semiconductor wafer. The dopant ions which diffuse by an interstitialcy mechanism have diffusivity greatly reduced, which leads to a very low resistivity doped region and a very shallow junction.

10 Claims, 5 Drawing Sheets

METHOD FOR SHALLOW DOPANT DISTRIBUTION

CROSS REFERENCE TO RELATED APPLICATIONS

This application is a divisional application of application Ser. No. 10/237,417 filed Sep. 9, 2002 (now U.S. Pat. No. 6,812,523), and claims priority pursuant to 35 U.S.C. 119(e) to the following U.S. Provisional Applications: Application No. 60/323,862 filed Sep. 21, 2001 and Application No. 60/323,863 filed Sep. 21, 2001. All of the above applications are incorporated herein by reference in their entirety including incorporated material.

FIELD OF THE INVENTION

The present invention relates generally to the field of semiconductor manufacturing, and more particularly to ultra shallow junction formation in Si by defect engineering, and to apparatuses for their practice.

BACKGROUND OF THE INVENTION

Complementary metal-oxide-semiconductor (CMOS) technology has continued to evolve for the past 40 years with integrated circuit (IC) density quadrupling every three years to reduce cost and improve device performance (e.g. speed). Denser circuits need device scaling with requirement of increasingly compact (shallow and rapidly varying) doping profiles in both the source/drain junctions. The International Technology Roadmap for Semiconductors (ITRS) anticipates junctions around 25 nanometers (nm) deep, with sheet resistance of 250 Ohm/square for the 100 nm lithography technology generation. Junctions this shallow have approached the process limits of conventional implantation and thermal annealing processes. It is well known that boron dopants experience transient enhanced diffusion (TED) during post-implant annealing due to their interaction with the Si interstitials and that the activation of dopants is limited by the thermal solid solubility, as shown by A. E. Michel, W. Rausch, P. A. Ronsheim, and R. H. Kastl, Appl. Phys. Lett., 50 (1987) 416, and P. A. Stolk, H-J, Gosssmann, D. J. Eaglesham, D. C. Jacobson, C. S. Rafferty, G. H. Gilmer, M. Jaraiz, J. M. Poate, H. S. Luftman, and T. E. Haynes, J. Appl. Phys. 81, 6031(1997). It has become a daunting task to meet ITRS requirement with traditional methods such as very low energy ion implantation followed by rapid thermal annealing.

Furthermore, the conventional ion implantation techniques used to dope submicron silicon devices have throughput problems attributed to the fact that an ion beam implanter current drops significantly due to space charge limitations at very low ion energy. The attempts to meet these major technology challenges have led to the development of new processes which include: 1) ultra low energy implantation with energy reduced to sub keV region; 2) cluster ion implantation; 3) other doping methods such as plasma immersion ion implantation; 4) low thermal budget process with spike rapid thermal annealing and 5) other annealing processes such as laser annealing.

Each of these methods has its advantages and disadvantages. However, all of them have the disadvantage that they cannot solve the most serious problem, the spreading of the dopant profiles due to the transient enhanced diffusion and boride-enhanced diffusion (BED). For example, even though the very low energy boron implantation technique produces a shallow implantation profile, a burst of TED is observed upon annealing resulting in a junction several hundred nanometers (nm) deep. This phenomenon, known as transient enhanced diffusion, is caused by the interaction with silicon interstitials with the boron ions which are either on lattice sites in crystal silicon or in interstitial sites. Transient enhanced diffusion is observed for dopants that are mobile in Si through an interstitialcy mechanism, and have diffusivity enhancement proportional to the enhanced interstitial concentration. As a consequence of the implant damage due to collision cascades, the dopant diffusivity enhancement may be $10^2$–$10^4$ times larger than equilibrium diffusivity values. Another anomalous diffusion phenomenon, called boride-enhanced diffusion, has been observed in the proximity of a silicon layer containing a high boron concentration. (See, for example, Aditya Agarwal, H.-J. Gossmann, D. J. Eaglesham, S. B. Hemer, A. T. Fiory, and T. E. Haynes, Appl. Phys. Lett 74, 2435(1999)). Boride-enhanced diffusion is driven by the Si interstitials injected from the silicon boride layer during annealing. BED is a greater problem than TED because high concentrations of boron are necessary in any doping method used. Therefore there is a need in the art for methods for forming ultra-shallow junctions.

Several prior art approaches have attempted to reduce the transient enhanced diffusion for shallow junction formation. In one approach, a carbon co-implant was used to reduce the transient diffusion of boron dopant during rapid thermal anneal (RTA). The conditions employed in forming the shallow junction using carbon co-implantation were reported by P. A. Stolk, H-J, Gosssmann, D. J. Eaglesham, D. C. Jacobson, C. S. Rafferty, G. H. Gilmer, M. Jaraiz, J. M. Poate, H. S. Luftman, and T. E. Haynes, in J. Appl. Phys. 81, 6031(1997) as follows: 30 keV B implant, dose $1.5 \times 10^{14}$/$cm^2$, multiple carbon implant to a level of $4$–$6 \times 10^{18}$/$cm^3$, and regrown at 500° C. for 1 h, 600° C. for 2 h, and 900° C. for 15 min. Although carbon co-implant is effective in reducing the transient diffusion of boron, this method suffers from the disadvantage that high density of residual defects remain after RTA. This is the case even using high temperature anneal conditions. The high density of residual defects results in high electrical leakages for the shallow junction.

Another approach reported by T. H. Huang et al. ("Influence of Fluorine Preamorphization on the Diffusion and Activation of Low-energy Implanted Boron during Rapid Thermal Anneal," Appl. Phys. Lett., (1994) Vol. 65, No. 14, p. 1829) used fluorine co-implants to reduce the transient diffusion of boron dopants during rapid thermal anneals. The conditions used in this reference for shallow junction formation are as follows: fluorine implant, 40 keV ion energy, dose $2 \times 10^{15}$/$cm^2$, 5 keV boron or 23 keV BF.sub.2 shallow implants. In the process disclosed by Huang et al., the wafers were rapid thermal annealed at 1000° C., 1050° C. and 1100° C. for 30 seconds. Although the presence of fluorine implants reduced the transient boron enhanced diffusion during RTA, this prior art method also suffers from the disadvantage that residual defects remain after 1000° C., 30 seconds anneal. Residual defects can only be removed with 1100° C., 30 seconds anneal. However, substantial dopant motion occurs at this higher temperature and therefor ultra-shallow junctions cannot be formed.

Another approach reported by S. Saito entitled "Defect Reduction by MeV Ion Implantation for Shallow Junction Formation," Appl. Phys. Lett., (1993) Vol. 63, No. 2, p. 197 used fluorine implants for preamphorization (40 keV, $10^{15}$/$cm^2$), shallow implant; boron at 10 keV and $5 \times 10^{15}$/$cm^2$.

This was followed by ion implantation of either fluorine or silicon at 1 MeV energy or arsenic at 2 MeV energy. The dose used for the MeV implant was between $5 \times 10^{14}/cm^2$ and $5 \times 10^{15}/cm^2$ The samples were rapid thermal annealed at 1000° C. or 1100° C. for 110 seconds. Under these experimental conditions, Saito demonstrated that the MeV implants were effective in reducing the boron transient diffusion with and without fluorine preamphorization. This reference also demonstrated that maximum reduction in boron dopant diffusion was achieved when both fluorine preamorphization and MeV fluorine implants were used. However, as mentioned in the prior art earlier, use of fluorine implants creates residual defects and requires temperatures as high as 1100° C. for low leakage junction to be formed.

In U.S. Pat. No. 6,037,640, Lee proposes a combination of low energy shallow dopant implant combined with high energy deep ion implant. Lee proposed that the high energy implant causes deeply buried defects which act as gettering centers for the interstitials and which are stable, and does not mention or suggest an excess of vacancies near the surface. Lee, however, showed junction depths of greater than 20 nm for the preamorphized and boron implanted samples, and junction depths greater than 30 nm if no preamorphization was used. In all cases, the dose of implanted boron used by Lee was sufficient to amorphize the surface of the silicon when a sufficient dose of boron for low sheet resistance was used.

The prior art shows no doping method where boron is introduced on to or into a silicon surface which remains crystalline, and which has an excess of vacancies to act to reduce the TED and BED of the boron, where the annealed junction depth is less than or equal to 20 m and where the doping level when annealed is sufficient to provide a sheet resistance of less than 400 ohms/square.

A method for forming ultra shallow junctions that overcome the disadvantages noted above is provided herein.

OBJECTS OF THE INVENTION

It is an object of the invention to produce ultrashallow junctions in a semiconductor material by controlling vacancy concentration in the semiconductor near the surface and hence controlling diffusion of dopant material. 20 nm combined with sheet resistance of less than 2000 ohms/square, more preferably with sheet resistance less than 400 ohms/square, and most preferably less than the 200 ohms/square. 15 nm combined with sheet resistance of less than 4000 ohms/square, more preferably with sheet resistance less than 800 ohms/square, and most preferably less than the 300 ohms/square.

It is an object of the invention to produce junction depths less than 10 nm combined with sheet resistance of less than 10,000 ohms/square, more preferably with sheet resistance less than 1000 ohms/square, and most preferably less than the 200 ohms/square.

It is an object of the invention to provide a method of ensuring that high boron concentrations in silicon occupy substitutional lattice sites.

It is an object of the invention to provide a method of ensuring that a boron dopant in silicon provides more activity than would be provided by boron at the equilibrium solid solubility limit.

SUMMARY OF THE INVENTION

We demonstrated that ultra-shallow junction formation of sub 10 nm junctions having low sheet resistance can be realized by the technique of point defect engineering. When high densities of boron atoms are introduced on or near the surface of a silicon wafer so that the surface of the silicon remains crystalline, and high, non-equilibrium densities of vacancies are carefully introduced into the surface region of the crystal and retained until the wafer is annealed, the boron diffusion is greatly retarded and the boron substitutional ratio (the ratio of the number of boron ions on substitutional sites to the total number of boron ions) is greatly enhanced over that of the equilibrium crystal. In one of embodiment, by judiciously separating vacancy and interstitial defects in different depths underneath a silicon surface using different high incident energy ion implants and dosages, boron diffusion can be retarded. We demonstrated that ultra-shallow junction formation of sub 10 nm junctions having low sheet resistance can be formed.

DETAILED DESCRIPTION OF THE INVENTION

The method provided for is a point defect engineering approach to shallow junction formation. In one embodiment of the point defect engineering approach, we first modify the background point defect concentration profile of the semiconductor crystal material by high energy ion bombardment of Si and then introduce boron or another interstitialcy type diffusing dopant into Si to form the ultra-shallow junction. Silicon wafers are bombarded with ions at energy ranges between 100 keV and 4 MeV with a dose high enough to produce the required point defect density and distribution, but low enough so that the crystal near the surface region is not amorphized. The high energy ion implantation creates a vacancy-rich region close to the surface and leaves behind a region with excessive interstitials near the end of the projected range, as shown by K. B. Winterbon, Rad. Eff. 46, p. 181(1980). The high energy ions are preferably chosen from the group of elemental semiconductors such as silicon or germanium, since such ions produce practically no effect when implanted deeply into the silicon and then annealed. A set of buried dislocation loops may be left if a high enough temperature anneal is not used. Such dislocation loops have been proposed as gettering sites for impurities and point defects.

In other preferred embodiments, a dopant ion such as arsenic, phosphorous, or other dopant may be used. After the high-energy ion bombardment, a boron layer, or boron doped layer is deposited onto the irradiated Si surface to form a junction by thermal diffusion.

Figure 1:
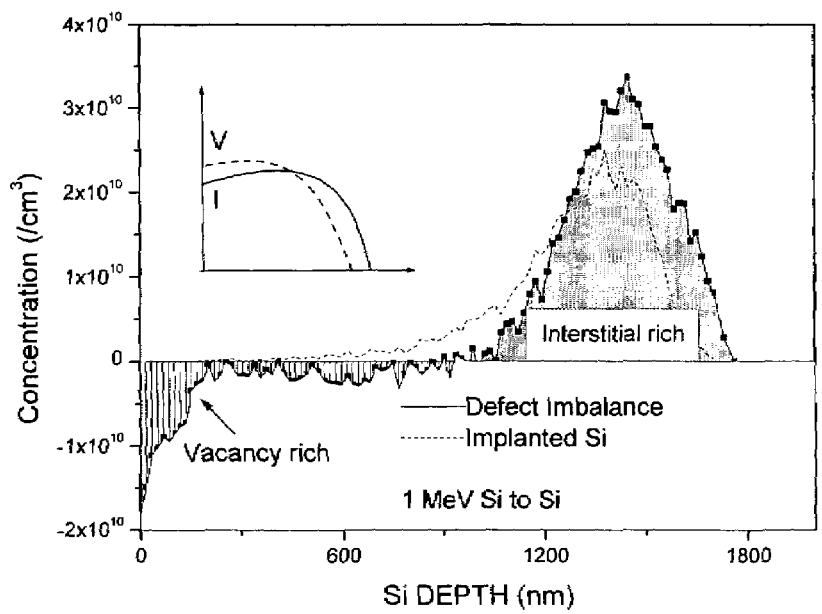
FIG. 1. Shows a graph of a typical Transport of Ions in Matter (TRIM) simulation of defect caused by $1 \times 10^6$ Si atoms/$cm^2$ implanted with 1 MeV energy into Si.

FIG. 1 shows a graph of a typical TRIM simulation of defects caused by $1\times10^6$ Si ions/cm$^2$ implanted at 1 MeV into Si. Note that the point defect densities scale with the actual dose of the high energy implants, and we can use FIG. 1 to predict the number density of vacancies produced by our experimental doses in the $10^{14}$–$10^{15}$ ions/cm$^2$ dose range. The excess vacancies near the surface reduce the interstitial density greatly. In the context of the interstitialcy diffusion mechanism, boron diffusion will be suppressed in an environment of reduced Si interstitial concentration. Boron atoms are easily trapped by vacancies, and there are fewer interstitials to kick them out of their substitutional lattice sites once they are so trapped, and thus the chance that boron will occupy a substitutional site is increased in vacancy rich region. Therefore, using the high energy ion implantation method provided herein nullifies the transient enhanced diffusion and boride-enhanced diffusion and results in a much shallower junction than has been provided heretofore by any injection or implantation of boron into or onto the surface of a patterned silicon wafer. The activation of the boron is also higher since the boron ions are more likely to reside on substitutional lattice sites. I fact, the boron may be active at concentrations higher than that provided by the equilibrium boron solid solubility limit.

We have identified two key parameters for point defect engineering using high energy ion implantation: 1) implantation energy that determines the spatial separation between interstitials and vacancies, and 2) implantation dosage that determines the vacancy and interstitial concentrations. By managing the above two parameters, we can control the diffusion of boron due to the transient enhanced diffusion mechanism and the boride enhanced diffusion mechanism.

Figure 2:
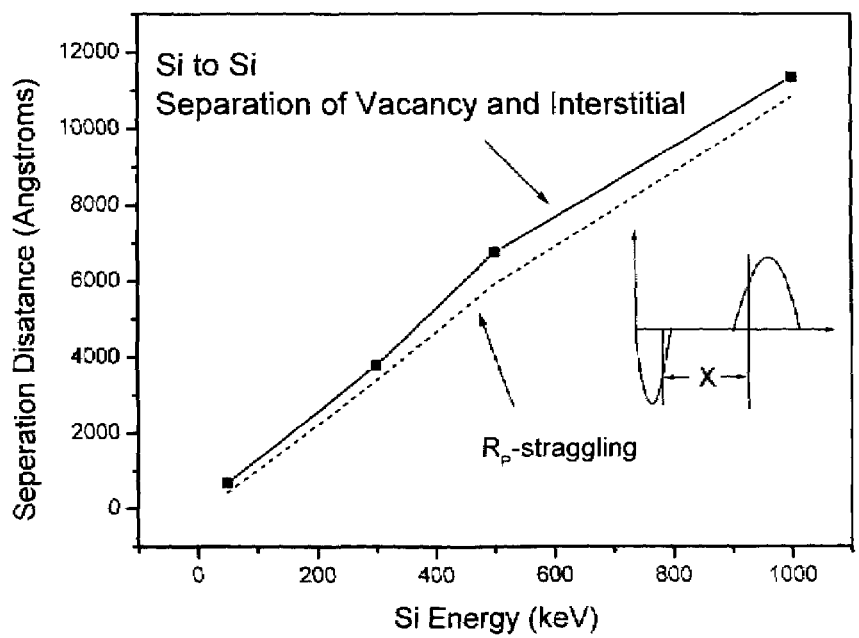
FIG. 2. shows a graph of a typical demonstration of the average separation between extra vacancies and extra interstitials as a function of the incident energy of Si ions used in implantation.

FIG. 2. shows a graph of a typical demonstration of the average separation between extra vacancies and extra interstitials as a function of the incident energy of Si ions used in implantation.

Figure 3:
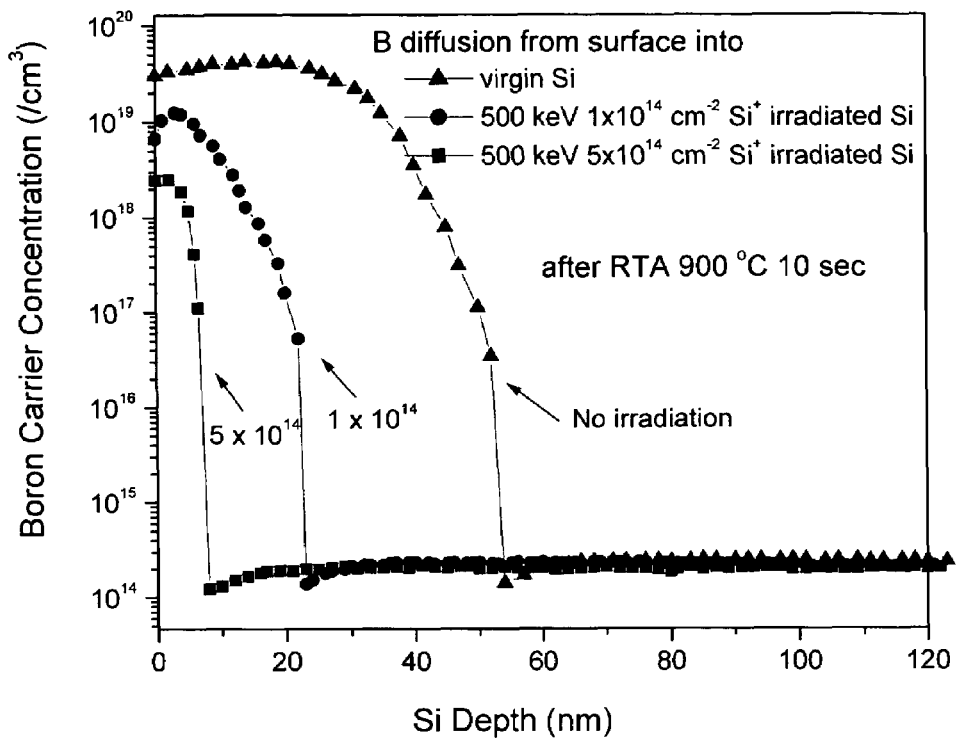
FIG. 3. shows a graph of a typical spreading resistance profiles of samples first implanted with 500 keV Si ions to a dose of $1 \times 10^{14}$ or $5 \times 10^{14}/cm^2$ respectively, followed by deposition of a 10 nm layer of boron, and annealing.

FIG. 3. shows a graph of a typical spreading resistance profiles of samples first implanted with 500 keV Si ions to a dose of $1\times10^{14}$ or $5\times10^{14}$/cm$^2$ respectively, followed by deposition of a 10 nm layer of boron, and annealing. (For very shallow spreading resistance profiles, the surface peak carrier concentrations were underestimated due to measurement limitation, e.g. carrier spilling). Note that the high energy implant has drastically reduced the boron diffusion, and that the highest dose measured provides a junction depth with well under 10 nm depth.

Figure 4:
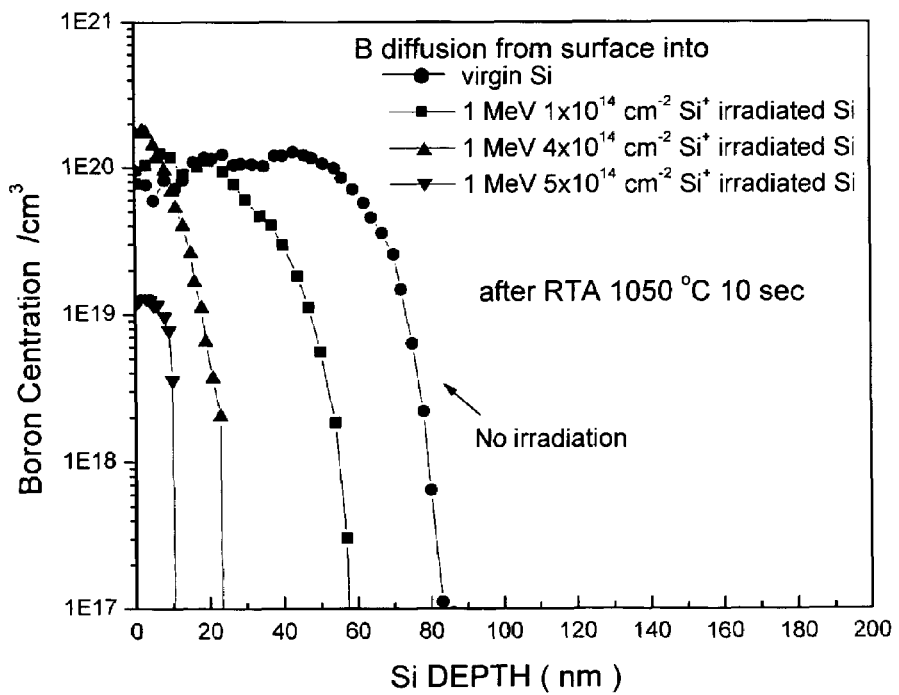
FIG. 4. shows a graph of a typical spreading resistance profiles of boron doped silicon.

FIG. 4 shows results for spreading resistance measurements obtained with the preferred embodiment of the invention. An n-type (100) Czochralski-grown Si wafer was first implanted with 1 Mev Si ions to a dose of $1\times10^{14}$, $4\times10^{14}$ or $5\times10^{14}$/cm$^2$, respectively, followed by deposition of a 10 nm layer of boron. The deposition process was immediately preceded by a HF etch to remove the native oxide. A liquid nitrogen cooled substrate holder was used to decrease the mobility of the deposited boron atoms to avoid boron island formation. After the deposition, Si wafers were rapid thermal annealed at 1050° C. for 10 sec to reduce the sheet resistance of the boron implanted region. This leads to a charge carrier concentration profile as shallow as 10 nm.

Doses of Mev silicon ions as high as $10^{16}$/cm$^2$ were used to produce more vacancies near the surface. However, the resulting junctions were so shallow that the spreading resistance could not be measured.

The inventors contemplate other embodiments of the point defect engineering method for forming ultra shallow junctions. For example: boron dopants can be introduced by methods known in the art other than film deposition. Boron dopants can be introduced into Si by ultra low energy (sub Kev) boron implantation or boron cluster ion implantation. Another embodiment of the invention is to introduce boron dopants by film deposition or ultra low energy implantation first, then followed by the high-energy ion bombardments to modify the substrates.

During junction formation, furnace or rapid thermal annealing were used to activate dopants. Annealing can be performed both before and after high-energy ion implantation. In this case, boron is introduced into the surface and the wafer is annealed at temperatures where the boron does not move. Preliminary experiments show that very low energy implanted boron can be annealed at temperatures less than 500 or 600° C., where the dopant ions do not move, and then implanted with high energy ions and further annealed from 850 to 1150° C. The inventors surmise that a low temperature anneal removes some interstitials and/or recrystalizes some amorphous material and allows the high energy implant to produce even higher vacancy densities, which slow boron diffusion and increase the boron substitutional ratio when the wafer is held at high temperature.

In a preferred embodiment using low energy ion implantation of boron, care must be taken to swamp the interstitials produced by the boron implant with vacancies produced by the high energy implant, or else the boron will move rapidly until it reaches a depth where the vacancy concentration is the controlling factor. In all cases, care must be taken that the vacancies are not removed in the processing of the wafer.

Other preferred embodiments of the invention are anticipated by the inventors, in that other methods of injection or production of vacancies are known in the art. In particular, materials which react with silicon to produce an excess of vacancies are known. Among these materials are the silicide forming materials cobalt, titanium, and tungsten, which are used extensively in silicon processing. Boron deposited on top of a silicide layer will diffuse readily through the silicide and into the underlying silicon where, if the vacancies produced by the silicidation of the surface are carefully preserved, it will diffuse very slowly to form an extremely shallow junction. It is preferred to ensure that the silicide-silicon interface is smooth. In particular, the roughness of the silicide-silicon interface should preferably be less than 2 nm, and most preferably be less than 1 nm.

The silicide-silicon interface of a cobalt silicide may be smoothed using a titanium diffusion barrier between the cobalt and the silicon, and/or by depositing cobalt and rapidly raising the temperature of the wafer above the nucleation temperature before all the cobalt is consumed to make $CO_2Si$.

A preferred embodiment of the invention is to cool the wafer rapidly from a high temperature so that the high levels of vacancies and interstitials formed in equilibrium are "frozen in". The interstitials are much more mobile than the vacancies, and will diffuse away to the surface or into the wafer and be trapped. The less mobile vacancies will remain in excess near the surface, and prevent boron deposited on the surface and driven in from diffusing at a rapid rate.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

EXAMPLES

The following examples are submitted to illustrate but not to limit this invention.

Example 1 n-type (100) Czochralski-grown Si wafers were first implanted with 500 keV Si ions to a dose of $1 \times 10^{14}$ or $5 \times 10^{14}/cm^2$, respectively, followed by an HF etch to remove the native oxide and then by deposition of a 10 nm layer of boron. A liquid nitrogen cooled substrate holder was used to hold the wafer during the boron deposition to decrease the mobility of the deposited boron atoms to avoid boron island formation. A layer about 4 nm thick was uniformly deposited. After the deposition, Si wafers were rapid thermal annealed at 900° C. for 10 sec. FIG. 3. shows a graph of a typical spreading resistance profiles of samples first implanted with 500 keV Si ions to a dose of $1 \times 10^{14}$ or $5 \times 10^{14}/cm^2$ respectively, followed by deposition of a 10 nm layer of boron, and annealing Example 2 n-type (100) Czochralski-grown Si wafers were first implanted with 1 MeV Si ions with doses of $1 \times 10^{14}/cm^2$, $4 \times 10^{14}/cm^2$ and $5 \times 10^{14}/cm^2$ respectively, then a thin boron layer was deposited on the cooled wafer by by e-gun deposition. Subsequent annealing was at 1050° C. for 10 sec.

FIG. 4 shows a graph of typical spreading resistance profiles of boron doped silicon.

Example 3 n-type (100) Czochralski-grown Si wafers were first implanted with $5 \times 10^{14}/cm^2$ of $Si^+$ ions with incident energies of 50 keV or 500 keV, and then a 10 nm thick boron layer was deposited onto the cooled surface of the Si substrate. The samples were subsequently annealed at 900° C., 950° C. and 1050° C. for 15 sec. Using higher energy bombardment such as 500 keV to get a larger separation of vacancies and interstitials, boron diffusion was further suppressed over that of 50 keV implanted sample.

Figure 5:
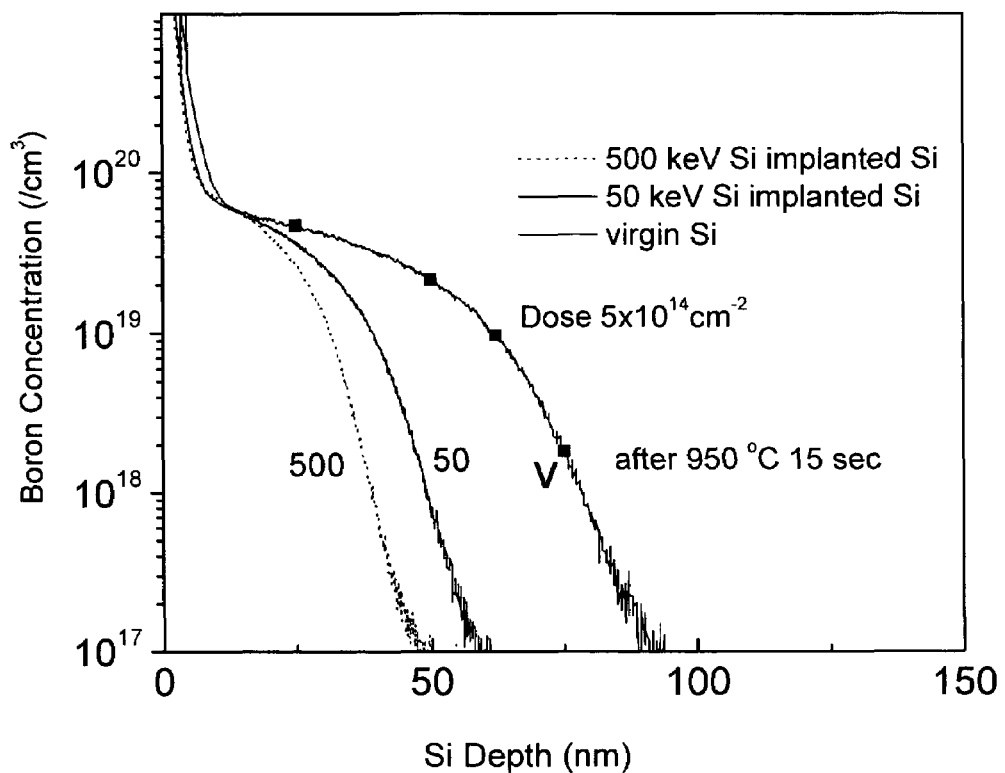
FIG. 5. shows a graph of a typical secondary ion mass spectrometry of depth profiles of boron diffused from a surface deposited layer into an ion implantation damaged Si substrate.

FIG. 5 shows a graph of typical secondary ion mass spectrometry (SIMS) depth profiles of boron diffused from a surface deposited layer into an high energy ion implantation damaged Si substrate.

Example 4

An n-type (100) Czochralski-grown Si wafer was first implanted with $3 \times 10^{15}/cm^2$ of $Si^+$ ions with incident energies of 500 keV, followed by 2 keV boron ion implantation to a dosage of $3.5 \times 10^{14}/cm^2$. Subsequent rapid thermal annealing was performed at 1000° C. for 10 seconds. It shows that 2 keV boron diffusion tails were suppressed with Si co-implants, but that the damage caused by the boron implant was not sufficiently compensated by vacancies produced by the high energy silicon implant.

Figure 6:
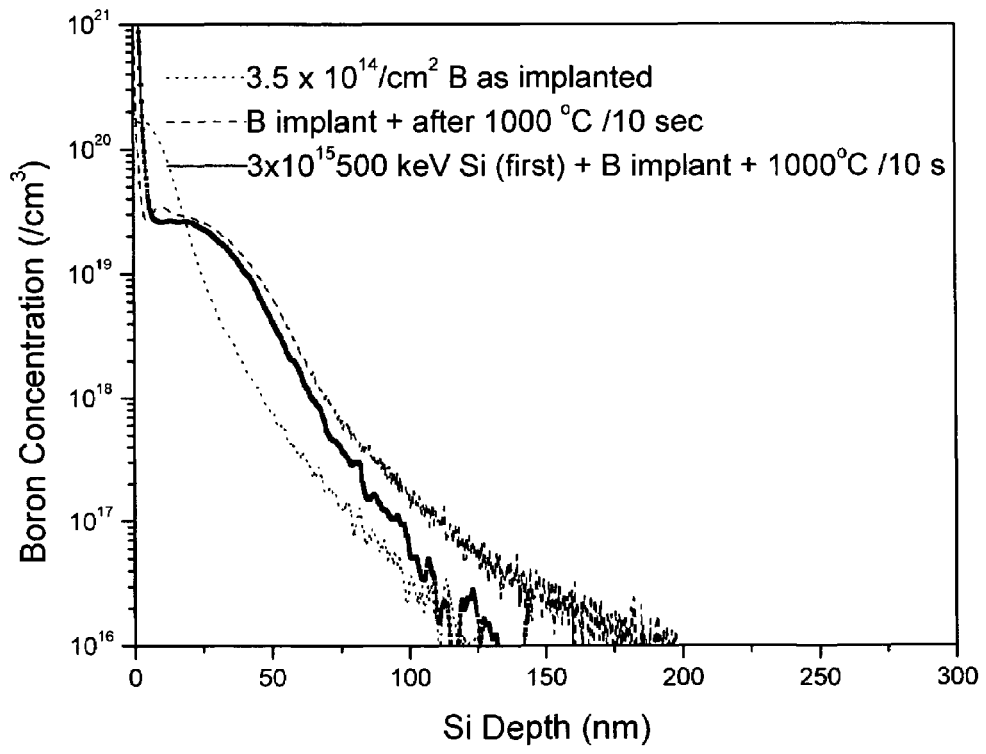
FIG. 6. shows a typical graph of secondary ion mass spectrometry of depth profiles of boron in 2 keV boron implanted Si sample with or without 500 keV Si co-implantation.

FIG. 6 shows a typical graph of secondary ion mass spectrometry of depth profiles of boron in 2 keV boron implanted Si sample with or without 500 keV Si co-implantation.

Figure 7:
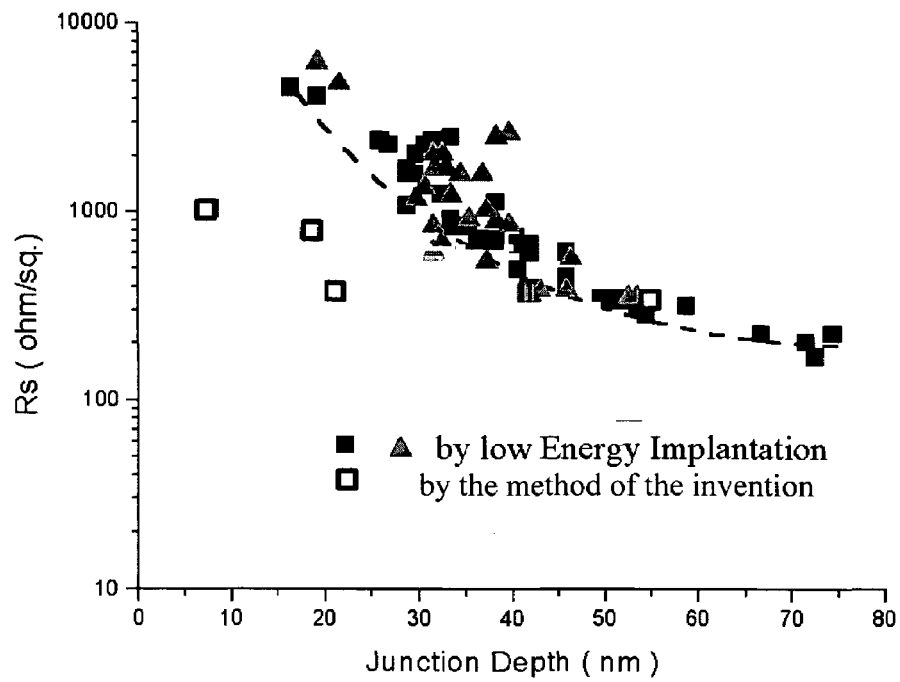
FIG. 7. shows a typical graph of experimental data of sheet resistance versus junction depths.

FIG. 7 shows a typical graph of experimental data of sheet resistance versus junction depths presented in L. Shao, X. Lu, X. Wang, I. Rusakova, J. Liu and W. K. Chu, "Defect Engineering: A New Approach on Ultra-Shallow Junction in Silicon", J. Vac. Sci. and Tech. B. 20, (2002)419 for a number of typical prior art shallow junctions compared with the results of the present work. The junction depth is generally arbitrarily defined in the literature as the depth at which the dopant concentration drops to $10^{18}/cm^3$. Note that the sheet resistance of the samples of the present work is almost an order of magnitude less than that of the prior art for junction depths of around 20 nm, and that the shallowest junction is approximately 7 nm with a sheet resistance of 1000 ohm/square.

The inventors anticipate that further experimentation with high energy implant dose and energy and annealing condition will decrease the sheet resistance from those values shown in FIG. 7.

Preferred embodiments of the present invention give junction depths less than 20 nm combined with sheet resistance of less than 2000 ohms/square, more preferably with sheet resistance less than 500 ohms/square, and most preferably less than the 200 ohms/square. Other preferred embodiments of the invention give junction depths less than 15 nm combined with sheet resistance of less than 4000 ohms/square, more preferably with sheet resistance less than 750 ohms/square, and most preferably less than the 400 ohms/square. Other preferred embodiments of the invention give junction depths less than 10 nm combined with sheet resistance of less than 10,000 ohms/square, more preferably with sheet resistance less than 1000 ohms/square, and most preferably less than the 400 ohms/square.

Figure 8:
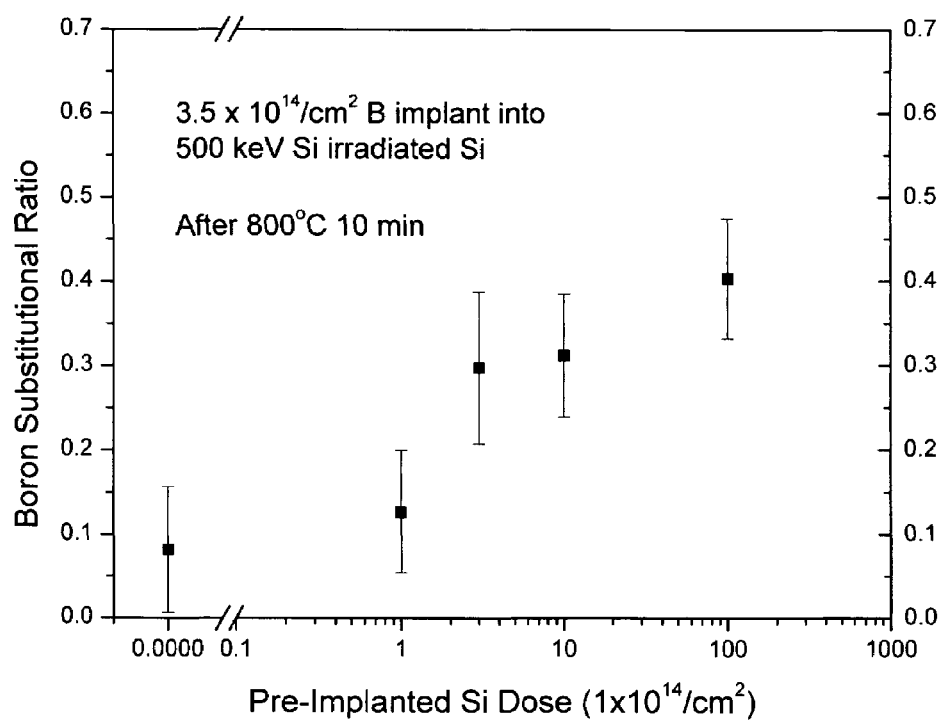
FIG. 8. shows graph of boron substitutional ratio as a function of high energy implant dose.

FIG. 8 shows the substitutional ratio of boron which has been implanted into high energy ion implanted silicon, then annealed at 800° C. for 10 minutes. Note that the excess vacancy production of the high energy implant increases the substitutional ratio. Nuclear reaction analysis was performed using a wide resonance reaction of

at a proton energy of around 650 keV. The measurements at a channeling direction and at a random direction would give signals proportional to the amount of B interstitials and the total amount of B atoms respectively. Therefore, the fraction of the substitutional boron S can by calculated after calibration. The relatively low ratio, e.g. 10% for control sample without high energy implants, is likely due to the pile-up of boron near the surface region and boron clustering above solid solubility. B substitutional ratio is anticipated to be increased with a higher annealing temperature.

Figure 9A:
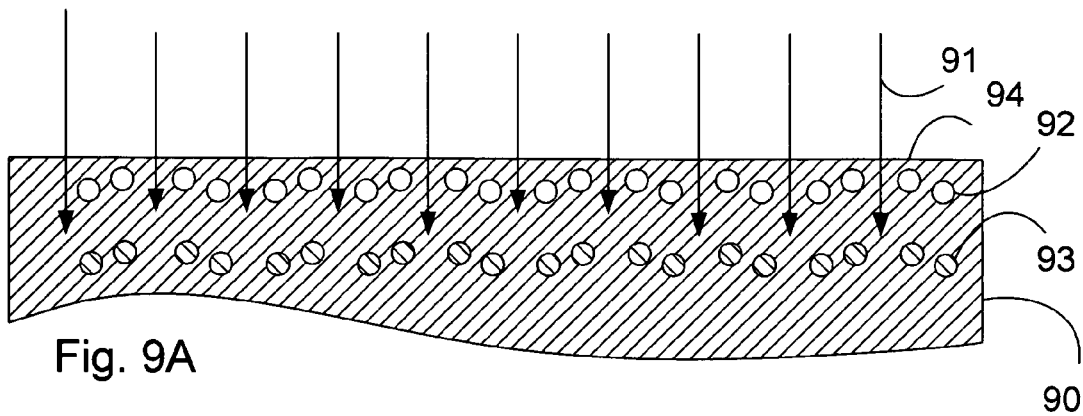
FIGS. 9A, B, and C show a sketches of the method and apparatus of the invention.
Figure 9B:
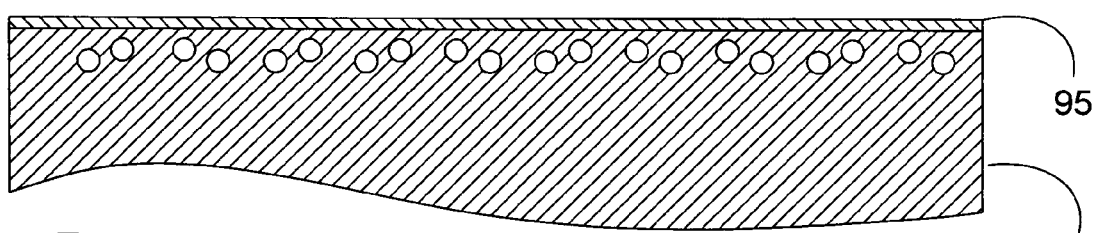
Figure 9C:
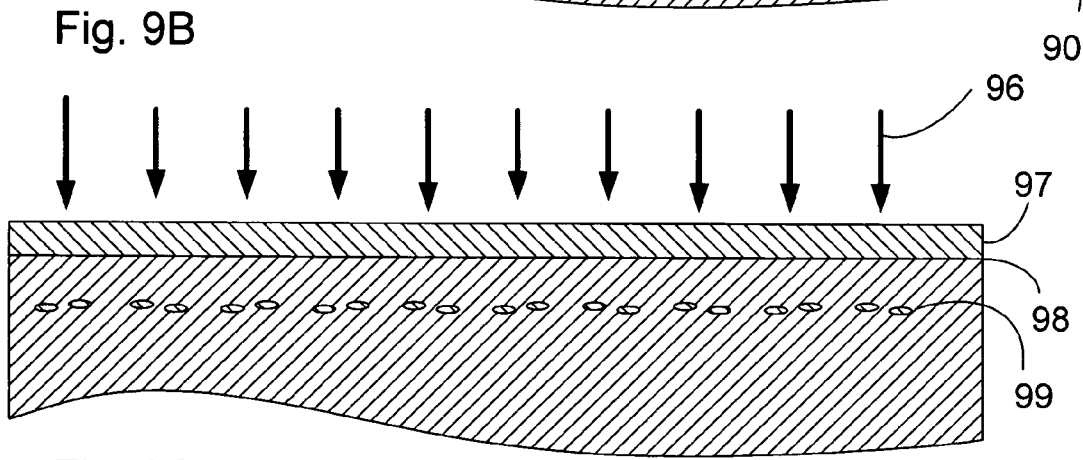

FIGS. 9 (A–C) show sketches of the method and apparatus of the invention. A semiconductor wafer 90 has vacancies 92 introduced near the surface 94 of the wafer by implanting ions 91 which leave interstitials 93 deep in the wafer 90 as shown in FIG. 9A. Alternatively, vacancies 92 may be introduced into the wafer by other means such as reaction of the surface material to make materials such as silicides. A layer of dopant material 95 is placed on the surface 94 of the vacancy laden wafer. Alternatively, dopant material is implanted (not shown) by low energy ion implantation very near the surface 94 of the wafer 90. FIG. 9C shows that heat 96 from a heat source (not shown) drives the dopant material 95 into the surface to form a very thin layer 97 of highly doped material which forms a junction 98 with respect to the material of the wafer 90. Optionally, evidence 99 of the high energy ion implantation is left in the wafer after heat treatment to drive in dopant material 95 or to anneal damage left by implanted dopant material.

While the bulk of the examples have used silicon wafers, other semiconductor wafers such as compound semiconductor wafers, silicon-germanium, and silicon of insulator wafers are anticipated by the inventors.

While the bulk of the examples have used boron as the dopant species, other dopant species which diffuse by interstitialcy mechanisms are anticipated by the inventors.

While the bulk of the examples have used silicon ions as the high energy implant ion, other ions such as germanium and other group IV ions are anticipated by the inventors. Also, dopant ions such as arsenic, phosphorous, and other dopant ions for the elemental semiconductor and compound semiconductor materials are anticipated. Also, the noble gas ions such as Ar, Kr, or Ne are anticipated by inventors for use as the high energy interstitial creating ion.

All references cited herein and the references cited therein are incorporated by reference.

Obviously, many modifications and variations of the present invention are possible in light of the above teachings. It is therefore to be understood that, within the scope of the appended claims, the invention may be practiced otherwise than as specifically described.

We claim:

1. A method, comprising:
    a) bombarding the surface of a semiconductor wafer with a high energy ions with a dose sufficient to introduce an excess of vacancies into the semiconductor wafer near the surface, and wherein the semiconductor material remains crystalline near the surface; then
    b) applying a first dopant material on to the surface of the semiconductor wafer; then
    c) driving in the first dopant material into the semiconductor wafer by heating the wafer;
    wherein the excess of vacancies near the surface is sufficient prevent the dopant from being driven into the semiconductor wafer to form a junction wherein the junction depth is more than or equal to 20 nm from the surface if the sheet resistivity of the doped crystalline semiconductor layer is less than 500 ohms/square.

2. The method of claim 1, where the high energy ion implantation implants an elemental semiconductor ion.

3. The method of claim 1, where the high energy ion implantation implants a second dopant ion.

4. The method of claim 1, where the first dopant material is boron.

5. The method of claim 4, where the step of applying is the step of evaporating boron on to the surface as the semiconductor wafer is held at a low temperature.

6. The method of claim 4, where the step of applying is the step of depositing boron on to the surface as a charged ion.

7. The method of claim 1, where the step of driving in is carried out in a rapid thermal processing (RTP) apparatus.

8. The method of claim 1, where the material of the semiconductor wafer is chosen from the group consisting of silicon, silicon-germanium, and silicon on insulator wafers.

9. A method, comprising:
    a) bombarding the surface of a semiconductor wafer with a high energy ions with a dose sufficient to introduce an excess of vacancies into the semiconductor wafer near the surface, and wherein the semiconductor material remains crystalline near the surface; and then
    b) implanting a first dopant material into the surface of the semiconductor wafer, wherein the first dopant material is implanted as a very low energy ion beam; and then
    c) driving in the first dopant material into the semiconductor wafer by heating the wafer;
    wherein the excess of vacancies near the surface is sufficient prevent the dopant from being driven into the semiconductor wafer to form a junction wherein the junction depth is more than or equal to 20 nm from the surface if the sheet resistivity of the doped crystalline semiconductor layer is less than 500 ohms/square.

10. The method of claim 9, where the dopant material is boron.

* * * * *